(12) United States Patent
Ye et al.

(10) Patent No.: US 7,674,662 B2
(45) Date of Patent: Mar. 9, 2010

(54) PROCESS FOR MAKING THIN FILM FIELD EFFECT TRANSISTORS USING ZINC OXIDE

(75) Inventors: Yan Ye, Saratoga, CA (US); John M. White, Hayward, CA (US); David J. Eaglesham, Livermore, CA (US)

(73) Assignee: Applied Materials, Inc., Santa Clara, CA (US)

( * ) Notice: Subject to any disclaimer, the term of this patent is extended or adjusted under 35 U.S.C. 154(b) by 24 days.

(21) Appl. No.: 11/458,511

(22) Filed: Jul. 19, 2006

(65) Prior Publication Data

US 2008/0020550 A1    Jan. 24, 2008

(51) Int. Cl.
*H01L 21/84*    (2006.01)

(52) U.S. Cl. .................. 438/159; 438/151; 438/158

(58) Field of Classification Search .......... 438/159
See application file for complete search history.

(56) References Cited

U.S. PATENT DOCUMENTS

| | | | |
|---|---|---|---|
| 4,769,291 A | 9/1988 | Belkind et al. | |
| 4,816,082 A | 3/1989 | Guha et al. | |
| 5,279,679 A | 1/1994 | Murakami et al. | |
| 5,346,601 A | 9/1994 | Barada et al. | |
| 5,352,300 A | 10/1994 | Niwa | |
| 5,420,452 A | 5/1995 | Tran et al. | |
| 5,522,934 A | 6/1996 | Suzuki et al. | |
| 5,571,749 A | 11/1996 | Matsuda et al. | |
| 5,620,523 A | 4/1997 | Maeda et al. | |
| 5,668,663 A | 9/1997 | Varaprasad et al. | |
| 5,683,537 A | 11/1997 | Ishii | |
| 5,700,699 A | 12/1997 | Han et al. | |
| 5,716,480 A | 2/1998 | Matsuyama et al. | |
| 5,720,826 A | 2/1998 | Hayashi et al. | |
| 5,963,797 A * | 10/1999 | Hyun | .......... 438/149 |
| 5,993,594 A | 11/1999 | Wicker et al. | |
| 6,150,668 A | 11/2000 | Bao et al. | |
| 6,153,013 A | 11/2000 | Sakai et al. | |
| 6,159,763 A | 12/2000 | Sakai et al. | |
| 6,180,870 B1 | 1/2001 | Sano et al. | |

(Continued)

FOREIGN PATENT DOCUMENTS

KR    1999009046    5/1999

(Continued)

OTHER PUBLICATIONS

Masuda, Satoshi "Transparent thin film transistors using ZnO as an active channel layer and their electrical properties" Jour. of App. Physics vol. 93 No. 3 Feb. 2003 pp. 1624-1630.*

(Continued)

*Primary Examiner*—N Drew Richards
*Assistant Examiner*—Grant S Withers
(74) *Attorney, Agent, or Firm*—Patterson & Sheridan

(57) ABSTRACT

The present invention comprises a method of forming a zinc oxide based thin film transistor by blanket depositing the zinc oxide layer and the source-drain metal layer and then wet etching through the zinc oxide while etching through the source-drain electrode layer. Thereafter, the active channel is formed by dry etching the source-drain electrode layer without effectively etching the zinc oxide layer.

19 Claims, 4 Drawing Sheets

U.S. PATENT DOCUMENTS

| | | | |
|---|---|---|---|
| 6,228,236 B1 | 5/2001 | Rosenstein et al. | |
| 6,238,527 B1 | 5/2001 | Sone et al. | |
| 6,329,269 B1 | 12/2001 | Hamada et al. | |
| 6,388,301 B1 | 5/2002 | Tawada et al. | |
| 6,458,673 B1 | 10/2002 | Cheung | |
| 6,488,824 B1 | 12/2002 | Hollars et al. | |
| 6,556,180 B1 | 4/2003 | Furuhashi et al. | |
| 6,620,719 B1 | 9/2003 | Andry et al. | |
| 6,700,057 B2 | 3/2004 | Yasuno | |
| 6,787,010 B2 | 9/2004 | Cuomo et al. | |
| 6,825,134 B2 | 11/2004 | Law et al. | |
| 6,881,305 B2 | 4/2005 | Black et al. | |
| 6,943,359 B2 | 9/2005 | Vardeny et al. | |
| 6,953,947 B2 | 10/2005 | Son et al. | |
| 7,037,157 B2 | 5/2006 | Murakami et al. | |
| 7,158,208 B2 * | 1/2007 | De Jager et al. | 355/30 |
| 7,235,810 B1 | 6/2007 | Yamazaki et al. | |
| 2003/0015234 A1 | 1/2003 | Yasuno | |
| 2003/0049464 A1 | 3/2003 | Glenn et al. | |
| 2003/0207093 A1 | 11/2003 | Tsuji, et al, | |
| 2004/0018797 A1 | 1/2004 | Murakami et al. | |
| 2004/0113098 A1 | 6/2004 | Vardeny et al. | |
| 2004/0164294 A1 | 8/2004 | Son et al. | |
| 2004/0175511 A1 | 9/2004 | Hartig | |
| 2005/0028860 A1 | 2/2005 | Sano et al. | |
| 2005/0062057 A1 | 3/2005 | Yamazaki et al. | |
| 2005/0062409 A1 | 3/2005 | Yamazaki et al. | |
| 2005/0067953 A1 | 3/2005 | Yamazaki et al. | |
| 2005/0181532 A1 | 8/2005 | Patel et al. | |
| 2005/0233092 A1 | 10/2005 | Choi et al. | |
| 2005/0233595 A1 | 10/2005 | Choi et al. | |
| 2005/0251990 A1 | 11/2005 | Choi et al. | |
| 2006/0011139 A1 | 1/2006 | Sterling et al. | |
| 2006/0038182 A1 | 2/2006 | Rogers et al. | |
| 2006/0043447 A1 | 3/2006 | Ishii et al. | |
| 2006/0046476 A1 * | 3/2006 | Nakamura et al. | 438/669 |
| 2006/0065299 A1 | 3/2006 | Fukawa et al. | |
| 2007/0007125 A1 | 1/2007 | Krasnov et al. | |
| 2007/0030569 A1 | 2/2007 | Lu et al. | |
| 2007/0065962 A1 | 3/2007 | Pichler | |
| 2007/0068571 A1 | 3/2007 | Li et al. | |

FOREIGN PATENT DOCUMENTS

KR            2001051193            6/2001

OTHER PUBLICATIONS

Masuda, et al. "Transparent thin film transistors using ZnO as an active channel layer and their electrical properties," Journal of Applied Physics, vol. 93, No. 3, Feb. 1, 2003, American Institute of Physics, pp. 1624-1630.

PCT International Search Report and the Written Opinion dated Oct. 15, 2007 for International Application No. PCT/US07/66166.

Futsuhara et al. "Optical properties of zinc oxynitride thin films," Thin Solid Films, vol. 317, 1998 Elsevier, pp. 322-325.

International Search Report and Written Opinion dated Aug. 8, 2008 for International Application No. PCT/US08/59638.

Tu et al. "Nitrogen-doped p-type ZnO films prepared from nitrogen gas radio-frequency magnetron sputtering," Journal of Applied Physics, vol. 100, Issue 5, 2006 American Institute of Physics, pp. 053705-053705-4.

Zong et al. "Optical band gap of zinc nitride films prepared on quartz substrates from a zinc nitride target by reactive rf magnetron sputtering," Applied Surface Science, vol. 252, Nov. 22, 2006, pp. 7983-7986.

International Search Report and Written Opinion dated Oct. 8, 2008 for International Application No. PCT/US2008/071890.

Toyoura et al., "Optical properties of zinc nitride formed by molten salt electrochemical process", Thin Film Solids 492 (2005), pp. 88-92.

Ma et al., "Method of control of nitrogen content in ZnO films: Structural and photoluminescence properties", J. Vac. Sci. Technol. B 22(1), Jan./Feb. 2004, pp. 94-98.

Fortunato et al., "Wide-bandgap high-mobility ZnO thin-film transistors produced at room temperature", Applied Physics Letters, vol. 85, No. 13, Sep. 27, 2004, pp. 2541-2543.

Hoffman et al., "ZnO-based transparent thin-film transistors", Applied Physics Letters, vol. 82, No. 5, Feb. 3, 2003, pp. 733-735.

Zong et al., "Optical band gap of zinc nitride films prepared on quartz substrates from a zinc nitride target by reactive rf magnetron sputtering", Applied Surface Science 252 (2006), pp. 7983-7986.

Bian et al., "Deposition and electrical properties of N-In codoped p-type ZnO films by ultrasonic spray pyrolysis", Applied Physics Letters, vol. 84, No. 4, Jan. 26, 2004, pp. 541-543.

Barnes et al., "On the formation and stability of p-type conductivity in nitrogen-doped zinc oxide", Applied Physics Letters, 86, 112112 (2005).

Hirao et al., "4.1: Distinguished Paper: High Mobility Top-Gate Zinc Oxide Thin-Film Transistors (ZnO-TFTs) for Active-Matrix Liquid Crystal Displays", SID 06 Digest (2006), pp. 18-20.

Hosano et al., "Working hypothesis to explore novel wide band gap electrically conducting amorphous oxides and examples", Journal of Non-Crystalline Solids, 198-200 (1996) pp. 165-169.

Park et al., "Highly Stable $Ga_2O_3$-$In_2O_3$-ZnO Thin-Film Transistors for AM-OLED Application", IDW '07, pp. 1775-1778.

Kwon et al., "4 inch QVGA AMOLED display driven by GaInZnO TFT", IDW '07, pp. 1783-1786.

Perkins et al., "Identification of nitrogen chemical states in N-doped ZnO via x-ray photoelectron spectroscopy", Journal of Applied Physics 97, 034907 (2005).

Yao et al., "Effects of nitrogen doping and illumination on lattice constants and conductivity behavior of zinc oxide grown by magnetron sputtering", Journal of Applied Physics 99, 123510 (2006).

Tu et al., "Nitrogen-doped p-type ZnO films prepared from nitrogen gas radio-frequency magnetron sputtering", Journal of Applied Physics 100, 053705 (2006).

Klaitabtim et al., "Growth and Characterization of Zinc Oxynitride Thin Films by Reactive Gas-Timing RF Magnetron Sputtering", Japanese Journal of Applied Physics, vol. 47, No. 1, 2008, pp. 653-656.

Lee et al., "42.2: World's Largest (15-inch) XGA AMLCD Panel Using IGZO Oxide TFT", SID 08 Digest, pp. 625-628.

Zong et al., "Structural properties of zinc nitride empty balls", Materials Letters 60 (2006), pp. 905-908.

Nomura et al., "Room-temperature fabrication of transparent flexible thin-film transistors using amorphous oxide semiconductors", Nature, vol. 432, Nov. 25, 2004, pp. 788-492.

Minami, Tadatsugu, "New n-Type Transparent Conducting Oxides", MRS Bulletin, Aug. 2000.

Zong et al., "Synthesis and thermal stability of $Zn_3N_2$ powder", Solid State Communications 132 (2004), pp. 521-525.

Kaminska et al., "Transparent p-type ZnO films obtained by oxidation of sputter-deposited $Zn_3N_2$", Solid State Communications, 135 (2005), pp. 11-15.

Son et al., "42.4L: Late-News Paper: 4 inch QVGA AMOLED Driven by the Threshold Voltage Controlled Amorphous GIZO ($Ga_2O_3$-$In_2O_3$-ZnO) TFT", SID 08 Digest, pp. 633-636.

Futsuhara et al., "Optical properties of zinc oxynitride thin films", Thin Film Solids, 317 (1998), pp. 322-325.

Futsuhara et al., "Structural, electrical and optical properties of zinc nitride thin films prepared by reactive rf magnetron sputtering", Thin Film Solids, 322 (1998), pp. 274-281.

Carcia et al., "Transparent ZnO thin-film transistor fabricated by rf magnetron sputtering", Applied Physics Letters, col. 82, No. 7, Feb. 17, 2003, pp. 1117-1119.

Yan et al., "Control of Doping by Impurity Chemical Potentials: Predictions for p-type ZnO", Physical Review Letters, vol. 86, No. 25, Jun. 18, 2001, pp. 5723-5726.

Ohya et al., "Thin Film Transistor of ZnO Fabricated by Chemical Solution Deposition", Jpn. J. Appl. Phys., vol. 40 (2001), pp. 297-298.

Hossain, et al., "Modeling and simulation of polycrystalline ZnO thin-film transistors", Journal of Applied Physics, vol. 94, No. 12, Dec. 15, 2003, pp. 7768-7777.

Park et al., "Challenge to Future Displays: Transparent AM-OLED driven by PEALD grown ZnO TFT", IMID '07 Digest, pp. 1249-1252.

Hirao et al., "Bottom-Gate Zinc Oxide Thin-Film Transistors (ZnO TFTs) for AM-LCDs", IEEE Transactions on Electron Devices, col. 55, No. 11, Nov. 2008, pp. 3136-3142.

Fortunato, et al. "Fully transparent ZnO thin-film transistor produced at room temperature," Advanced Materials, 2005, 17, No. 5, Mar. 6, 2005, Wiley-VCH verlag Gbmh & Co. KGaA, Weinheim, pp. 590-594.

Hiramatsu et al. "4.1: Distinguished Paper: High Mobility Top-Gate Zinc Oxide Thin-Film Transistors (ZnO-TFTs) for Active-Matrix Liquid Crystal Displays," SID 06 Digest ISSN0006-0966X/06/3701-0018-$1.00+.00, 2006, pp. 18-20.

Li et al. "Progress in semiconducting oxide-based thin-film transistors for displays," Institute of Physics, Semicon. Sci. Technol. 20 (2005), pp. 720-725.

Ozgur, et al. "A comprehensive review of ZnO materials and devices," Journal of Applied Physics 98, 041301 (2005), American Institute of Physics.

Wang, et al. "Epitaxial growth of NH3-doped ZnO thin films on <0224> oriented sapphire substrates," Journal of Crystal Growth 255, Apr. 9, 2003, pp. 293-297.

Ye, et al. "Preparation and characteristics of p-type ZnO films by DC reactive magnetron sputtering," Journal of Crystal Growth 253, Feb. 4, 2003, pp. 258-264.

Korean Office Action dated Jul. 21, 2008 for Korean Application No. 10-2007-0066962.

Hirao, et al. "Formation of TiN films with low Cl concentration by pulsed plasma chemical vapor deposition," American Vacuum Society, vol. 14, No. 3, May/Jun. 1996, pp. 1037-1040.

* cited by examiner

PROCESS FOR MAKING THIN FILM FIELD EFFECT TRANSISTORS USING ZINC OXIDE

BACKGROUND OF THE INVENTION

1. Field of the Invention

Embodiments of the present invention generally relate to methods for forming zinc oxide based thin film transistors.

2. Description of the Related Art

Current interest in thin film transistor (TFT) arrays is particularly high because these devices are used in liquid crystal active matrix displays of the kind often employed for computer and television flat panels. The liquid crystal active matrix displays may also contain light emitting diodes for back lighting. Further, organic light emitting diodes (OLEDs) have been used for active matrix displays, and these OLEDs require TFTs for addressing the activity of the displays.

The TFT arrays may be created on a flat substrate. The substrate may be a semiconductor substrate, or may be a transparent substrate such as glass, quartz, sapphire, or a clear plastic film. A gate dielectric layer overlies a gate electrode. A passivation dielectric overlies the upper surface of a second conductive electrode, to electrically isolate the second conductive electrode from the ambient surrounding the upper surface of the TFT device.

TFTs made with amorphous silicon have become the key components of the flat panel display industry. Unfortunately amorphous silicon does have its limitations such as light sensitivity, light degradation, and limited aperture ratio for active matrix arrays. Another problem associated with amorphous silicon is its low field effect mobility. The mobility required for OLEDs is at least 10 times higher than that achievable with amorphous silicon. In recent years, transparent TFTs have been created in which zinc oxide has been used as the active channel layer. Zinc oxide is a compound semiconductor that can be grown as a crystalline material at relatively low deposition temperatures on various substrates such as glasses and plastics. Zinc oxide based TFTs will not degrade upon exposure to visible light. Therefore, a shield layer, as is necessary for silicon based TFTs is not present. Without the shield layer, the TFT remains transparent.

In forming zinc oxide and doped zinc oxide for TFTs used in flat panel displays, it is difficult to effectively deposit the zinc oxide and doped zinc oxide while also forming an active channel. There is a need in the art for effectively forming a zinc oxide based TFT.

SUMMARY OF THE INVENTION

The present invention generally comprises a method of forming a zinc oxide based TFT by blanket depositing a zinc oxide layer and a source-drain electrode layer then wet etching through the zinc oxide layer and the source-drain layer which will form the source-drain electrodes with a mask that covers both the source-drain electrodes and the TFT active channel. The etch process is a selective etch process wherein the etch will etch the source-drain electrode layer and the zinc oxide layer without etching the gate dielectric layer. A dry etch follows to define the source-drain electrodes by etching away the source-drain layer on top of the zinc oxide area of the TFT active channel. The dry etch process is also a selective etch process that etches the source-drain electrode layer without etching the zinc oxide or gate dielectric layers.

In one embodiment, a method for forming a thin film transistor is disclosed. The method comprises blanket depositing zinc oxide layer over an entire substrate surface and patterning the zinc oxide layer.

In another embodiment, a method for forming a thin film transistor is disclosed. The method comprises depositing a gate electrode and a gate dielectric layer on a substrate, depositing a zinc oxide layer over the gate dielectric layer, depositing a source-drain metal layer over the zinc oxide layer, and etching the source-drain metal layer and the zinc oxide layer. Thereafter, the source-drain metal layer is selectively etched again to define the active channel of the TFT.

In yet another embodiment, a method for forming a thin film transistor is disclosed. The method comprises depositing an underlayer a substrate, depositing a zinc oxide layer over the underlayer, depositing a source-drain metal layer over the zinc oxide layer, and wet etching the source-drain metal layer and the zinc oxide layer. The source-drain metal layer may then be dry etched. Following the dry etching, an interlayer dielectric layer, contacts, and a passivation layer may be deposited.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DETAILED DESCRIPTION

The present invention comprises a method of forming a zinc oxide based TFT by blanket depositing the zinc oxide layer and a source-drain metal layer and then wet etching through the zinc oxide layer while etching through the source-drain electrode layer using a mask. The mask can be formed by a photolithographic process or an imprinting process. Thereafter, another mask is formed to pattern the active channel of the TFT. The source-drain electrodes are formed by dry etching the source-drain metal layer without etching the zinc oxide layer.

PVD System

Figure 1:
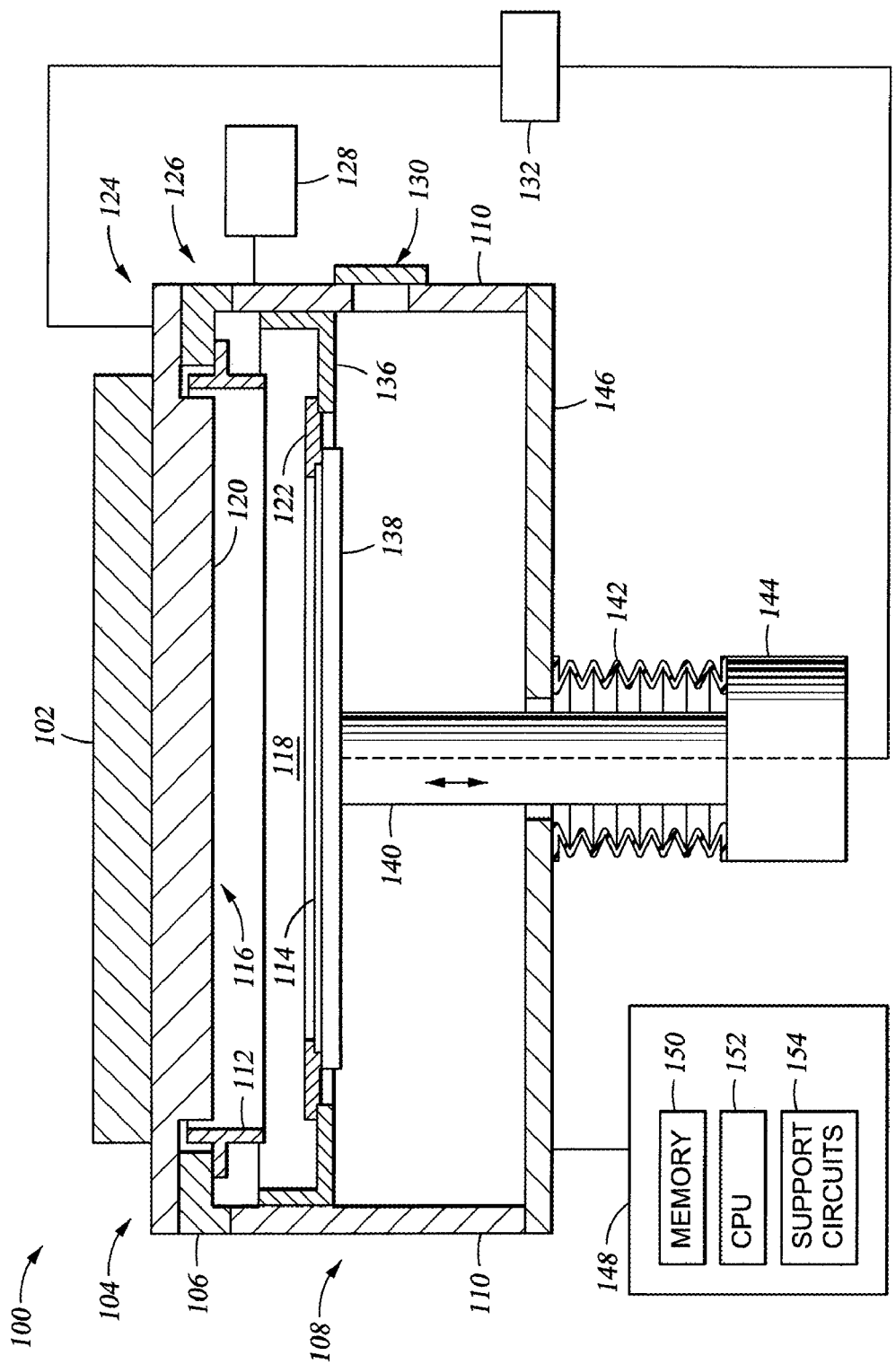
FIG. 1 illustrates a sectional view of one exemplary physical vapor deposition (PVD) chamber that may be used in connection with one or more embodiments of the invention.

FIG. 1 illustrates an exemplary reactive sputtering process chamber 100 for depositing material according to one embodiment of the invention. One example of the process chamber 100 that may be adapted to benefit from the invention is a PVD process chamber, available from AKT®, a division of Applied Materials, Inc., located in Santa Clara, Calif.

The process chamber 100 includes a chamber body 108 and a lid assembly 104, defining a process volume 118. The chamber body 108 may be fabricated from a unitary block of aluminum or welded stainless steel plates. The chamber body 108 includes sidewalls 110 and a bottom 146. The sidewalls 110 and/or bottom 146 include a plurality of apertures, such as an access port 130 and a pumping port (not shown). The pumping port is coupled to a pumping device (also not shown) that evacuates and controls the pressure within the process volume 118. The pumping device is able to maintain the pressure of the process chamber 100 to a high vacuum level. In one embodiment, the pressure level of the process chamber 100 may be maintained to about 1 Torr or less. In another embodiment, the pressure level of the process chamber 100 may be maintained at about $10^{-3}$ Torr or less. In yet another embodiment, the pressure level of the process chamber 100 may be maintained at about $10^{-5}$ Torr to about $10^{-7}$ Torr. In another embodiment, the pressure level of the process chamber 100 may be maintained at about $10^{-7}$ Torr or less.

The access port 130 is sealable, such as by a slit valve or other vacuum sealable assembly, and may be coupled to a transfer chamber and/or other chambers of a substrate processing system to provide entrance and egress of the substrate 114 (i.e., a solar panel, a flat panel display substrate or a semiconductor wafer) into and out of the process chamber 100. Other apertures, such as a shutter disk port (not shown) may also optionally be formed on the sidewalls 110 and/or bottom 146 of the chamber body 108.

The dimensions of the chamber body 108 and related components of the process chamber 100 are not limited and generally are proportionally larger than the size and dimension of the substrate 114 to be processed in the process chamber 100. In one embodiment, a large area substrate is processed having a width of about 370 mm to about 2160 mm and a length of about 470 mm to about 2460 mm, and the chamber body 108 includes a width of about 570 mm to about 2360 mm and a length of about 570 mm to about 2660 mm. In another embodiment, a substrate size of about 1000 mm×1200 mm is processed, and the chamber body 108 has a cross sectional dimension of about 1750 mm×1950 mm. In yet another embodiment, a substrate size of about 1950 mm×2250 mm is processed, and the chamber body 108 has a cross sectional dimension of about 2700 mm×3000 mm.

The lid assembly 104 generally includes a target 120 and a ground shield assembly 126 coupled thereto. The target 120 provides a material source that can be deposited onto the surface of the substrate 114 during a PVD process. The target 120 or target plate may be fabricated of a material that will become the deposition species or it may contain a coating of the deposition species. To facilitate sputtering, a high voltage power supply, such as a power source 132 is connected to the target 120.

The target 120 generally includes a peripheral portion 124 and a central portion 116. The peripheral portion 124 is disposed over the sidewalls 110 of the chamber. The central portion 116 of the target 120 may protrude, or extend in a direction towards a substrate support 138. It is contemplated that other target configurations may be utilized as well. For example, the target 120 may comprise a backing plate having a central portion of a desired material bonded or attached thereto. The target material may also comprise adjacent tiles or segments of material that together form the target.

Optionally, the lid assembly 104 may further comprise a magnetron assembly 102, which enhances consumption of the target material during processing. Examples of the magnetron assembly include a linear magnetron, a serpentine magnetron, a spiral magnetron, a double-digitated magnetron, a rectangularized spiral magnetron, among others.

Referring back to FIG. 1, during a sputtering process to deposit a material on the substrate 114, the target 120 and the substrate support 138 are biased relative each other by the power source 132. A process gas, such as inert gas and other non-reactive or reactive gases (i.e., argon, oxygen, etc.) is supplied to the process volume 118 from a gas source 128 through one or more apertures (not shown), typically formed in the sidewalls 110 of the process chamber 100. The process gas is ignited into a plasma and ions within the plasma are accelerated toward the target 120 to cause target material to be dislodged from the target 120 into particles. The dislodged material or particles are attracted towards the substrate 114 through the applied bias, depositing a film of material onto the substrate 114.

The ground shield assembly 126 includes a ground frame 106, a ground shield 112, or any chamber shield member, target shield member, dark space shield, dark space shield frame, etc. The ground shield 112 surrounds the central portion 116 of the target 120 to define a processing region within the process volume 118 and is coupled to the peripheral portion 124 of the target 120 by the ground frame 106. The ground frame 106 electrically insulates the ground shield 112 from the target 120 while providing a ground path to the chamber body 108 of the process chamber 100, typically through the sidewalls 110. The ground shield 112 constrains the plasma within the region circumscribed by the ground shield 112 to ensure that target source material is only dislodged from the central portion 116 of the target 120. The ground shield 112 may also facilitate depositing the dislodged target source material mainly on the substrate 114. This maximizes the efficient use of the target material as well as protects other regions of the chamber body 108 from deposition or attack from the dislodged species or from the plasma, thereby enhancing chamber longevity and reducing the downtime and cost required to clean or otherwise maintain the chamber. Another benefit derived from the use of the ground frame 106 surrounding the ground shield 112 is the reduction of particles that may become dislodged from the chamber body 108 (for example, due to flaking of deposited films or attack of the chamber body 108 from the plasma) and re-deposited upon the surface of the substrate 114, thereby improving product quality and yield. The ground shield 112 may be formed of one or more work-piece fragments and/or one or more corner pieces, and a number of these pieces are bonded together, using bonding processes known in the art, such as welding, gluing, high pressure compression, etc.

A shaft 140 extends through the bottom 146 of the chamber body 108 and couples the substrate support 138 to a lift mechanism 144. The lift mechanism 144 is configured to move the substrate support 138 between a lower position and an upper position. The substrate support 138 is depicted in an intermediate position in FIG. 1. A bellows 142 is typically disposed between the substrate support 138 and the chamber bottom 146 and provides a flexible seal therebetween, thereby maintaining vacuum integrity of the chamber volume 118.

A shadow frame 122 and a chamber shield 136 may be disposed within the chamber body 108. The shadow frame 122 is generally configured to confine deposition to a portion of the substrate 114 exposed through the center of the shadow frame 122. When the substrate support 138 is moved to the upper position for processing, an outer edge of the substrate 114 disposed on the substrate support 138 engages the shadow frame 122 and lifts the shadow frame 122 from the chamber shield 136. When the substrate support 138 is moved into the lower position for loading and unloading the substrate 114 from the substrate support 138, the substrate support 138 is positioned below the chamber shield 136 and the access port 130. The substrate 114 may then be removed from or placed into the process chamber 100 through the access port 130 on the sidewalls 110 while cleaning the shadow frame 122 and the chamber shield 136. Lift pins (not shown) are selectively moved through the substrate support 138 to space the substrate 114 away from the substrate support 138 to facilitate the placement or removal of the substrate 114 by a transfer robot or a transfer mechanism disposed exterior to the process chamber 100, such as a single arm robot or dual arm robot. The shadow frame 122 may be formed of one piece or it may be two or more workpiece fragments bonded together in order to surround the peripheral portion of the substrate 114.

As shown in FIG. 1, a controller 148 is included to interface with and control various components of the substrate processing system. The controller 148 typically includes a central processing unit (CPU) 152, support circuits 154 and a memory 150. The CPU 152 may be one of any form of computer processor that may be used in an industrial setting for controlling various chambers, apparatuses, and chamber peripherals. The memory 150, any software, or any computer-readable medium coupled to the CPU 152, may be one or more readily available memory devices, such as random access memory (RAM), read only memory (ROM), hard disk, CD, floppy disk, or any other form of digital storage, for local or remote for memory storage. The support circuits 154 are coupled with the CPU 152 for supporting the CPU 152 in a conventional manner. These circuits include cache, power supplies, clock circuits, input/output circuitry, subsystems, and the like.

Thin Film Transistors

Transparent TFTs are becoming more prominent in industry. Zinc oxide has stepped to the forefront of the technology to become the n-type semiconductor layer of choice. Zinc oxide is beneficial because it is piezoelectric, has ferroelectric properties, and exhibits n-type conductivity so that it can function as the active channel in TFTs. Improved deposition techniques have allowed high quality zinc oxide films to be deposited. Reactive sputtering a metallic target (i.e., zinc) or RF sputtering a ceramic target (i.e., zinc oxide ceramic) are methods for depositing zinc oxide. Zinc oxide is one of the few oxides that may be deposited as a crystalline material at relatively low deposition temperatures on numerous substrates such as amorphous glasses and plastics. Upon exposure to visible light, zinc oxide will not degrade. Therefore, no shield is necessary to shield the active channel from visible light. Without the shield layer, the TFT with a zinc oxide active channel remains transparent to visible light. Because the active channel is transparent, the aperture ratio of the active matrix arrays may be increased.

In depositing zinc oxide, shadow masks have traditionally been used. A shadow mask is a mask that is placed down on a substrate so that deposition will occur only in the unmasked areas of the substrate. Shadow masks can be quite cumbersome, especially for large area substrates. For instance, to utilize a shadow mask, either the deposition chamber has to be opened so that a shadow mask may be placed into the chamber or the substrate has to be transferred to a separate, deposition chamber equipped with a shadow mask. For large area substrates, inserting a shadow mask into a deposition chamber can be quite cumbersome. A large area shadow mask may bow and also take up a significant amount of extra space in a processing system. It is also difficult to control the thickness of the zinc oxide and the interface between the semiconductor materials with the source-drain electrode. In processing large area substrates, cluster systems, such as those available from AKT®, a division of Applied Materials, Inc., located in Santa Clara, Calif., may take up a significant amount of space. Transferring a shadow mask into a deposition chamber or having a separate chamber with a shadow mask can take up valuable cluster space and could even result in the need for an additional cluster. Simply adding another cluster to a large area cluster tool could easily require the need to build a bigger building.

It would be beneficial to deposit the zinc oxide without using a shadow mask. Traditional photolithography is the solution. Instead of placing a shadow mask on the substrate and then depositing the zinc oxide only in the patterned areas of the mask, the zinc oxide may be blanket deposited over the substrate and then later removed by wet etching through a photolithographic mask while etching the source-drain electrode layer.

The benefit of using a photolithographic mask to etch the zinc oxide and a source-drain metal electrode together is that the interface between the zinc oxide and the source-drain metal is not affected by the wet etching process and avoids unnecessary exposure to ambient air to achieve good quality. In addition, the cost to break vacuum between steps is reduced. Additionally, the same etchant that is used to etch the source-drain electrode may be used to etch the zinc oxide layer. Therefore, the source-drain metal layer patterning may occur simultaneously with the zinc oxide layer etching.

In one embodiment, the zinc oxide layer is zinc oxide. In another embodiment, the zinc oxide layer is a doped zinc oxide layer. In yet another embodiment, the zinc oxide layer is a plurality of zinc oxide layers with one layer being zinc oxide and another layer being doped zinc oxide. It is to be understood that whenever a zinc oxide layer is described in the present patent application, all of the above possibilities for the zinc oxide layer are equally applicable.

A doped zinc oxide layer may be formed by doping a deposited zinc oxide layer with a dopant. The dopant may include aluminum, gallium, or tin. In one embodiment, a doped zinc oxide layer is deposited in a separate sputtering deposition step from the zinc oxide layer. A doped zinc oxide layer may be deposited to a thickness of about 100 Å to about 3,000 Å.

It is also to be understood that when forming the active channel, the dry etching does not effectively etch the zinc oxide layer. However, the zinc oxide layer may be etched by using another wet etching process or by forming the active channel during the original wet etching process, if desired.

Bottom Gate TFT

FIGS. 2A-2F illustrate one embodiment of forming a bottom gate TFT structure 200 by photolithographic patterning the zinc oxide layer simultaneously with the source-drain electrode.

Initially, a substrate 202 is provided with a gate electrode 204 thereon. Thereafter, a gate dielectric layer 206, a zinc oxide layer 208, and conductive metal layer 212 are deposited over the gate electrode 204 and the substrate 202 (see FIG. 2A). The conductive metal layer 212 will eventually become the source-drain electrodes.

The substrate 202 may comprise any material that is essentially optically transparent in the visible spectrum, such as, for example, glass, clear plastic, soda-lime glass, borosilicate glass, or quartz. The substrate may be of varying shapes or dimensions. In one embodiment, the substrate is a glass substrate with a surface area greater than about 2 m$^2$.

The gate electrode 204 comprises an electrically conductive layer that controls the movement of charge carriers within the TFT. The gate electrode layer 204 may comprise a metal such as aluminum, tungsten, chromium, tantalum, or combinations thereof. The gate electrode 204 may be formed using conventional deposition such as sputtering, lithography and etching techniques. In one embodiment, the gate electrode 204 is formed by pattern depositing the gate electrode 204 through a mask to directly form the pattern on the substrate. In another embodiment, the gate electrode 204 is formed by blanket depositing a gate electrode layer and then patterning the layer by providing a photolithographic mask thereon, and etching to remove portions of the layer. Optionally, an insulating material may be formed between the substrate 202 and the gate electrode 204.

The gate dielectric layer 206 may comprise silicon dioxide, silicon oxynitride or silicon nitride and may be deposited using a PECVD system. An exemplary PECVD system is available from AKT®, a division of Applied Materials, Inc., located in Santa Clara, Calif. The thickness of the gate dielectric layer 206 may be about 100 Å to about 6,000 Å.

The zinc oxide layer 208 may be formed by sputtering using the PVD system discussed above. In particular, the zinc oxide layer 208 may be formed by sputtering a zinc oxide target or by reactively sputtering a zinc target in a reactive atmosphere of oxygen. The zinc oxide layer 208 may be deposited to a thickness of about 100 Å to about 3,000 Å.

The conductive layer 212 may comprise a metal such as aluminum, tungsten, molybdenum, chromium, tantalum, and combinations thereof. The conductive layer 212 may be formed using conventional techniques such as sputtering using the PVD system described above.

Following the deposition of the conductive metal layer 212, a mask 210 may be formed over the conductive metal layer 212. The mask 210 may be formed by conventional techniques. The mask 210 may cover the active channel area of the TFT and leave portions of the conductive metal layer exposed (see FIG. 2B).

The conductive metal layer 212 and the zinc oxide layer 208 are then etched using a wet etchant. The wet etchant may be any conventional wet etchant that may etch the conductive metal layer 212. The wet etchant is a selective etchant because it may etch the conductive metal layer 212 and the zinc oxide layer 208, but may not effectively etch the gate dielectric layer 206. Following the etching, the mask 210 is removed (see FIG. 2C).

Figure 2A:
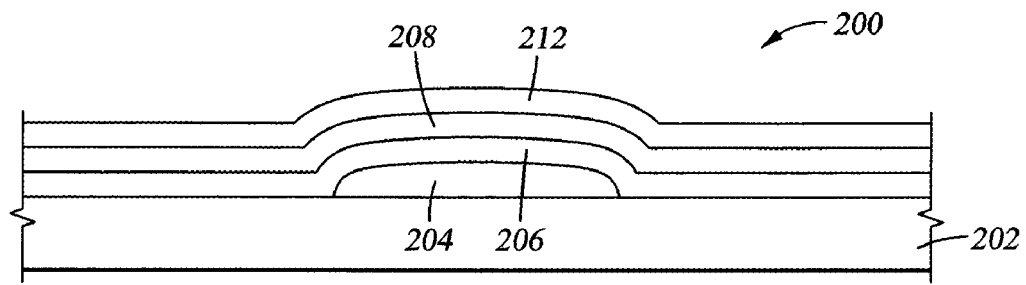
FIGS. 2A-2F illustrate a bottom gate TFT at various stages of production.
Figure 2B:
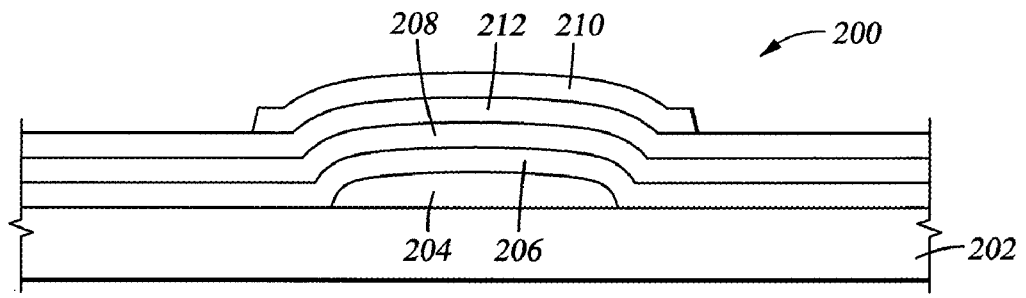
Figure 2C:
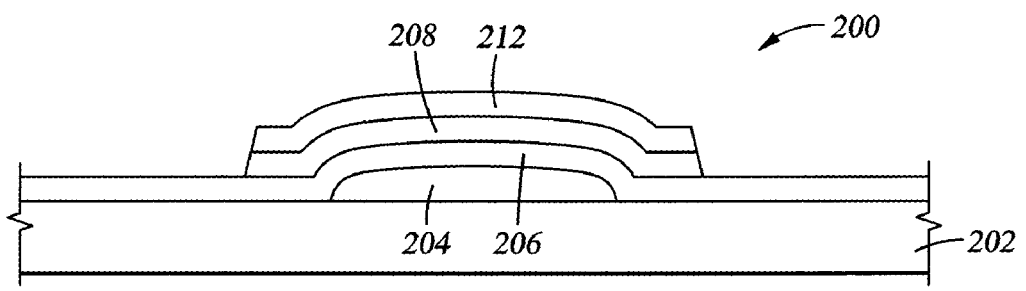
Figure 2D:
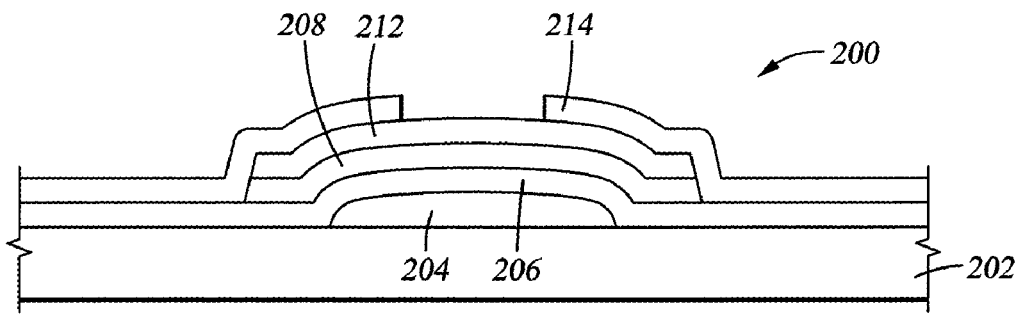

The structure is then ready to pattern the active channel while defining the source-drain contacts of the TFT. To prepare the structure for patterning, a photoresist is deposited onto the conductive metal layer 212 and then exposed and developed to form the pattern mask 214 as shown in FIG. 2D. The photoresist may be deposited, exposed, and developed using conventional techniques.

Figure 2E:
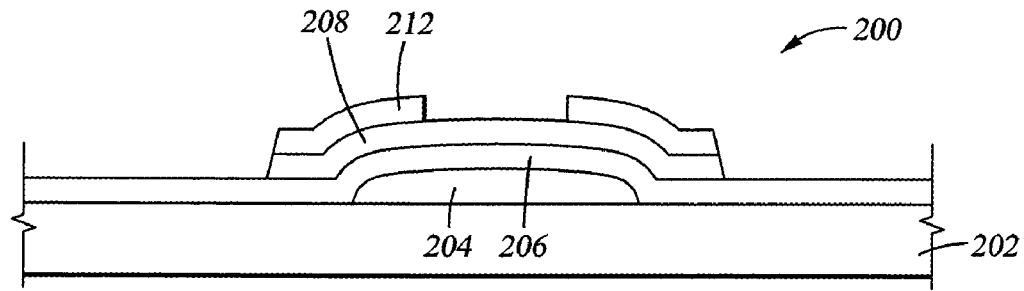

Following the formation of the mask 214, the conductive layer 212 may be etched to create the source-drain electrodes (see FIG. 2E). The etching is a dry etch step and may use conventional dry etchants that may etch the conductive layer 212. The dry etching is a selective etching process that etches the conductive metal layer 212, but does not effectively etch the zinc oxide layer 208 or the gate dielectric layer 206.

Figure 2F:
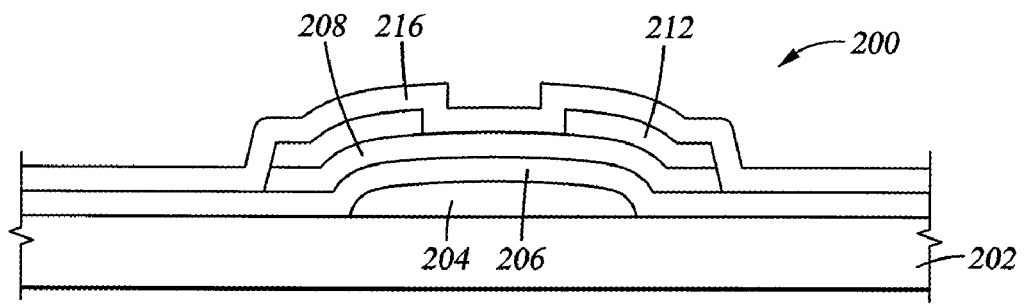

After the active channel is formed, the mask 214 is removed and a passivation layer 216 is deposited as shown in FIG. 2F. The passivation layer may be deposited to a thickness of about 1,000 Å to about 5,000 Å. The passivation layer 216 may comprise an insulator such as silicon dioxide or silicon nitride.

Top Gate TFT

A top gate structure using zinc oxide may also be formed. FIGS. 3A-3F illustrate the TFT structure 300 at various stages of development. The top gate TFT structure 300 may be a metal-oxide-semiconductor field effect transistor (MOSFET) or a junction field effect transistor (JFET).

Figure 3A:
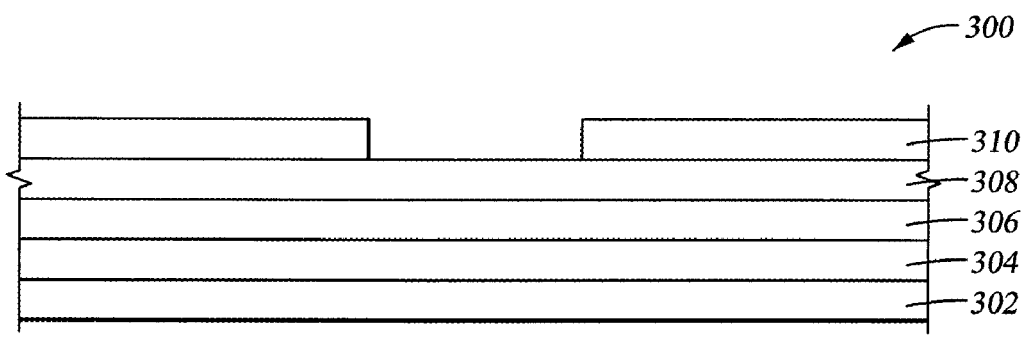
FIGS. 3A-3F illustrate a top gate TFT at various stages of production.

A shown in FIG. 3A, a substrate 302 is provided with an underlayer 304 thereon. The underlayer 304 may comprise an insulating material such as silicon dioxide or silicon nitride. Over the underlayer 304, a zinc oxide layer 306 is blanked deposited followed by a source-drain metal layer 308. In one embodiment, the zinc oxide layer 306 is deposited by sputtering.

Figure 3B:
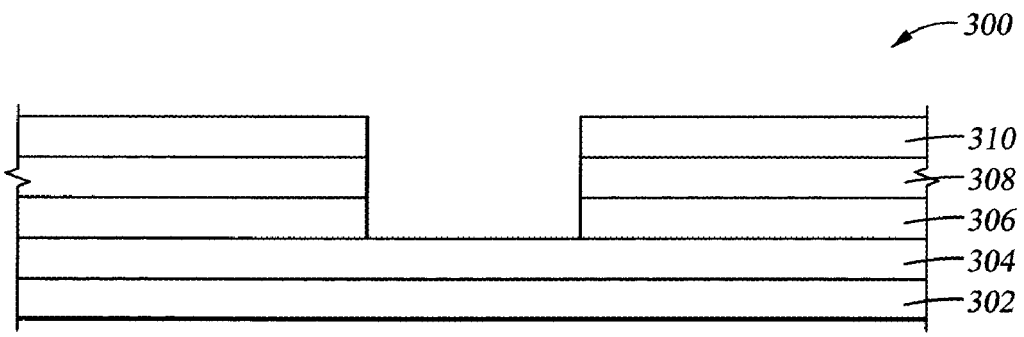

As shown in FIG. 3B, a photolithograph mask 310 is formed over the source-drain metal layer 308 by conventional techniques. The source-drain metal layer 308 and zinc oxide layer 306 are then wet etched as discussed above in relation to the bottom gate TFT through and the mask 310 is removed.

Figure 3C:
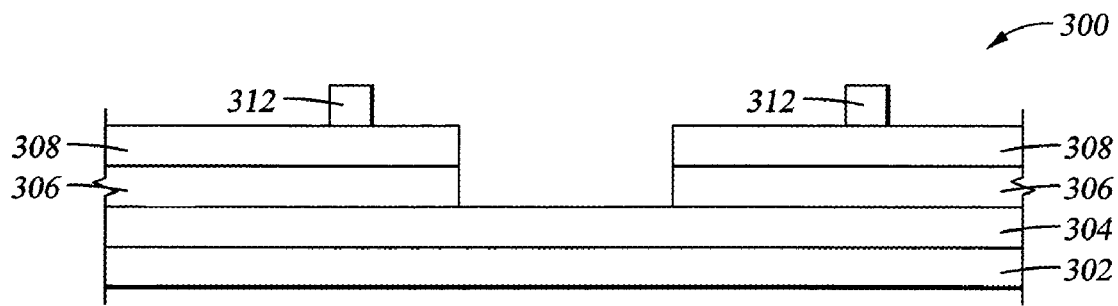
Figure 3D:
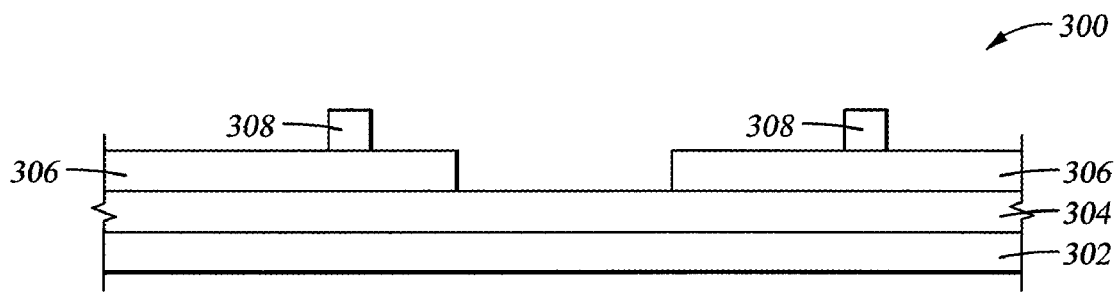
Figure 3E:
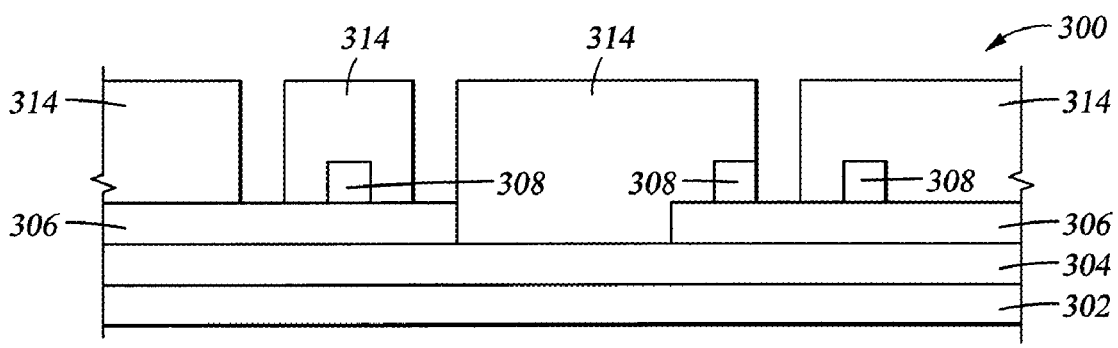
Figure 3F:
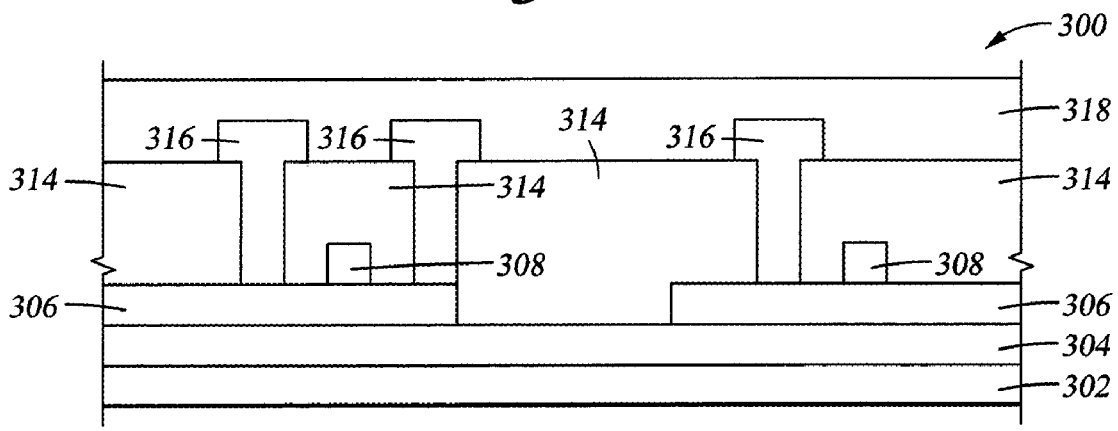

Another mask 312 is deposited over the source-drain metal layer 308 to define the areas of the source-drain electrodes (see FIG. 3C). The source-drain metal layer 308 is then patterned by dry etching as discussed above in relation to the bottom gate TFT to define the source-drain electrodes as shown in FIG. 3D. Thereafter, an interlayer dielectric layer 314 is deposited and patterned to expose portions of the zinc oxide layer 306 as shown in FIG. 3E. The interlayer dielectric may be formed by conventional techniques. The patterned regions of the interlayer dielectric layer 314 are then filled with conductive contact material to form the contacts 316. The contacts may comprise metal such as aluminum tungsten, molybdenum, chromium, tantalum, and combinations thereof. The contacts 316 may be formed by conventional techniques. Thereafter a passivation layer 318 is deposited over the structure 300 to encapsulate a completed TFT as shown in FIG. 3F.

By blanked depositing the zinc oxide layer, photolithographic patterning of the active region can occur while forming the source-drain regions of the TFT. A single wet etching step is used to etch both the zinc oxide layer and the source-drain metal layer. A single step wet etching process avoids the cumbersome shadow mask in large area substrates.

While the foregoing is directed to embodiments of the present invention, other and further embodiments of the invention may be devised without departing from the basic scope thereof, and the scope thereof is determined by the claims that follow.

We claim:

1. A method for forming a thin film transistor, comprising:
blanket depositing a zinc oxide layer over an entire substrate surface;
depositing a conductive metal layer over the zinc oxide layer;
depositing a mask;
etching the conductive metal layer and zinc oxide layer in a first etching step in a single process with the same etchant using the mask to expose a gate dielectric layer;
removing the mask; and then
patterning and etching the conductive metal layer in a second etching step to expose the zinc oxide layer and define source and drain electrodes.

2. The method of claim 1, wherein the zinc oxide layer is doped with aluminum, tin, or gallium.

3. The method of claim 1, wherein the zinc oxide layer is not deposited using a mask.

4. The method of claim 1, wherein the substrate has a surface area of at least about 2 m$^2$.

5. The method of claim 1, wherein etching the conductive metal layer and the zinc oxide layer comprises is wet etching.

6. The method of claim 1, wherein the zinc oxide layer is deposited by sputtering.

7. A method for forming a bottom gate thin film transistor, comprising:

depositing a zinc oxide layer over a gate electrode and a gate dielectric layer;

depositing a metal layer over the zinc oxide layer;

depositing a first mask;

wet etching the metal layer and the zinc oxide layer using the first mask;

removing the first mask; and patterning and dry etching the metal layer to expose the zinc oxide layer and define source and drain electrodes.

8. The method of claim 7, wherein the zinc oxide is doped with aluminum, tin, or gallium.

9. The method of claim 7, wherein the zinc oxide layer is not deposited using a mask.

10. The method of claim 7, wherein the substrate has a surface area of at least about 2 m$^2$.

11. The method of claim 7, wherein the dry etching further comprises:

depositing a photoresist layer;

pattern developing the photoresist layer; and dry etching the metal containing layer using the developed photoresist layer as a second mask, wherein the zinc oxide layer is not effectively etched.

12. The method of claim 7, wherein the zinc oxide is deposited by sputtering.

13. A method for forming a top gate thin film transistor, comprising:

depositing an underlayer on a substrate;

depositing a zinc oxide layer over the underlayer;

depositing a metal layer over the zinc oxide layer;

depositing a mask;

wet etching the metal layer and the zinc oxide layer using the mask;

removing the mask; and patterning and dry etching the metal layer to expose the zinc oxide layer and define source and drain electrodes.

14. The method of claim 13, wherein the zinc oxide is doped with aluminum, tin, or gallium.

15. The method of claim 13, wherein the zinc oxide layer is not deposited using a mask.

16. The method of claim 13, wherein the substrate has a surface area of at least about 2 m$^2$.

17. The method of claim 13, wherein the zinc oxide layer is deposited by sputtering.

18. The method of claim 1, wherein the conductive metal layer comprises a metal selected from the group consisting of aluminum, tungsten, molybdenum, chromium, tantalum, and combinations thereof.

19. The method of claim 7, wherein the metal layer comprises a metal selected from the group consisting of aluminum, tungsten, molybdenum, chromium, tantalum, and combinations thereof.

* * * * *

UNITED STATES PATENT AND TRADEMARK OFFICE
CERTIFICATE OF CORRECTION

PATENT NO. : 7,674,662 B2  Page 1 of 1
APPLICATION NO. : 11/458511
DATED : March 9, 2010
INVENTOR(S) : Ye et al.

It is certified that error appears in the above-identified patent and that said Letters Patent is hereby corrected as shown below:

On the title page, in the References Cited item (56):

Please delete "6,556,180 B1 4/2003 Furuhashi et al." and insert --6,566,180 B2 5/2003 Park et al.-- therefor;

Column 1, Line 40, please insert --,-- after TFTs.

Signed and Sealed this

Eighth Day of June, 2010

David J. Kappos
*Director of the United States Patent and Trademark Office*